United States Patent
Balakrishnan et al.

(10) Patent No.: US 9,786,782 B2
(45) Date of Patent: Oct. 10, 2017

(54) SOURCE/DRAIN FINFET CHANNEL STRESSOR STRUCTURE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/921,547

(22) Filed: Oct. 23, 2015

(65) Prior Publication Data
US 2017/0117409 A1    Apr. 27, 2017

(51) Int. Cl.
*H01L 29/78* (2006.01)
*H01L 29/165* (2006.01)
*H01L 29/66* (2006.01)

(52) U.S. Cl.
CPC ........ *H01L 29/7848* (2013.01); *H01L 29/165* (2013.01); *H01L 29/66795* (2013.01); *H01L 29/785* (2013.01)

(58) Field of Classification Search
CPC ........... H01L 29/7842; H01L 29/66795; H01L 29/7851
See application file for complete search history.

(56) References Cited

U.S. PATENT DOCUMENTS

| | | | |
|---|---|---|---|
| 8,525,262 B2 | 9/2013 | Wu et al. | |
| 8,658,505 B2 | 2/2014 | Cai et al. | |
| 8,659,091 B2 | 2/2014 | Cai et al. | |
| 8,884,298 B2 | 11/2014 | Maeda et al. | |
| 2012/0286329 A1* | 11/2012 | Cheng | H01L 29/66772 257/190 |
| 2013/0154029 A1 | 6/2013 | Cai et al. | |
| 2014/0070333 A1 | 3/2014 | Cheng et al. | |
| 2015/0137193 A1 | 5/2015 | Cheng et al. | |
| 2016/0126343 A1* | 5/2016 | Ching | H01L 29/785 257/192 |

\* cited by examiner

*Primary Examiner* — Moazzam Hossain
*Assistant Examiner* — Hajar Kolahdouzan
(74) *Attorney, Agent, or Firm* — Scully, Scott, Murphy & Presser, P.C.; Louis J. Percello, Esq.

(57) ABSTRACT

A semiconductor structure includes a material stack of, from bottom to top, an insulator structure and a semiconductor fin portion located on a pedestal portion of a semiconductor substrate portion, wherein a doped epitaxial semiconductor material structure extends from each sidewall surface of the semiconductor fin portion, each doped epitaxial semiconductor material structure introduces a stress on the semiconductor fin portion. A gate structure straddles the semiconductor fin portion. A source-side stressor structure having a bottommost surface contacting a first subsurface of the semiconductor substrate portion and covering one of the doped epitaxial semiconductor material structure is located on a source-side of the gate structure. A drain-side stressor structure having a bottommost surface contacting a second subsurface of the semiconductor substrate portion and covering another of the doped epitaxial semiconductor material structure is located on a drain-side of the gate structure.

18 Claims, 6 Drawing Sheets

US 9,786,782 B2

1

SOURCE/DRAIN FINFET CHANNEL STRESSOR STRUCTURE

BACKGROUND

The present application relates to semiconductor technology, and more particularly to a semiconductor structure containing a FinFET device having an improved stressor structure in the source/drain regions in which defects within the stressor structure are not present near the device channel. The present application also provides a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Fin field effect transistors (FinFETs) can achieve higher drive currents with increasingly smaller dimensions as compared to conventional planar FETs.

In the prior art, the formation of an embedded stressor within a semiconductor-on-insulator (SOI) FinFET starting from the substrate has been proposed to increase the volume of the embedded stressor. However, one concern with such an approach is that when the embedded stressor is epitaxially grown from the substrate, the epitaxial growth fronts meet with the channel material that is present near the gate spacer.

It is also known to grown the stressor material from both ends of a semiconductor fin as well as the substrate such that the epitaxy front ends up in the middle of the source/drain region. However, control of such a process is difficult to achieve.

SUMMARY

The present application provides a semiconductor structure containing a FinFET device having an improved stressor structure in the source/drain regions in which defects within the stressor structure are not present near the device channel. The present application also provides a method of forming such a semiconductor structure.

In one aspect of the present application, a semiconductor structure is provided. In one embodiment of the present application, the semiconductor structure includes a material stack of, from bottom to top, an insulator structure and a semiconductor fin portion located on a pedestal portion of a semiconductor substrate portion, wherein a doped epitaxial semiconductor material structure extends from each sidewall surface of the semiconductor fin portion, each doped epitaxial semiconductor material structure introduces a stress on the semiconductor fin portion. A gate structure straddles the semiconductor fin portion. A source-side stressor structure contacts a first subsurface of the semiconductor substrate portion and covers one of the doped epi-

2 taxial semiconductor material structures located on a source-side of the gate structure. A drain-side stressor structure contacts a second subsurface of the semiconductor substrate portion and covers another of the doped epitaxial semiconductor material structures located on a drain-side of the gate structure.

In another aspect of the present application, a method of forming a semiconductor structure is provided. In one embodiment of the present application, the method includes forming a gate structure straddling over a semiconductor fin portion, the semiconductor fin portion is located on an insulator layer that is positioned atop a semiconductor substrate. Next, a doped epitaxial semiconductor material structure is formed on each sidewall surface of the semiconductor fin portion. A sacrificial spacer is then formed covering each doped epitaxial semiconductor material structure. Exposed portions of the insulator layer are then removed and thereafter an undercut region is provided beneath a remaining portion of the insulator layer, wherein the providing the undercut region comprises partially etching of the semiconductor substrate to provide a semiconductor substrate portion containing a pedestal portion. The remaining portion of the insulator layer is then partially etched. Next, the sacrificial spacer is removed. A source-side stressor structure is formed contacting a first subsurface of the semiconductor substrate portion and covering one of the doped epitaxial semiconductor material structures located on a source-side of the gate structure, and a drain-side stressor structure is also formed contacting a second subsurface of the semiconductor substrate portion and covering another of the doped epitaxial semiconductor material structures located on a drain-side of the gate structure are thereafter formed.

DETAILED DESCRIPTION

Figure 1:
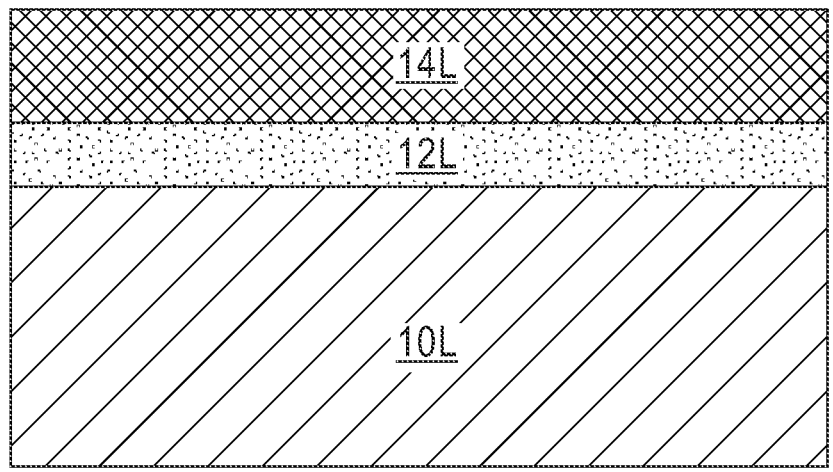
FIG. 1 is a cross sectional view of an exemplary semiconductor structure including a semiconductor-on-insulator (SOI) substrate including, from bottom to top, a semiconductor substrate, an insulator layer, and a topmost semiconductor layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a semiconductor-on-insulator (SOI) substrate including, from bottom to top, a semiconductor substrate 10L, an insulator layer 12L, and a topmost semiconductor layer 14L that can be employed in accordance with an embodiment of the present application.

In the present application, the semiconductor substrate 10L and the topmost semiconductor layer 14L of the exemplary semiconductor structure shown in FIG. 1 both include a semiconductor material. In one embodiment, the semiconductor substrate 10L and the topmost semiconductor layer 14L include a same semiconductor material. In another embodiment, the semiconductor substrate 10L and the topmost semiconductor layer 14L may include different semiconductor materials. The term "semiconductor" as used herein in connection with the semiconductor material of the semiconductor substrate 10L and the topmost semiconductor layer 14L denotes any semiconductor material including, for example, Si, Ge, SiGe, SiC, SiGeC, III-V compound semiconductors containing at least one element from Group III of the Periodic Table of Elements and at least one element from Group V of the Periodic Table of Elements, or II-VI compound semiconductors containing at least one element from Group II of the Periodic Table of Elements and at least one element from Group VI of the Periodic Table of Elements. Multilayers of these semiconductor materials can also be used as the semiconductor material of the semiconductor substrate 10L and the topmost semiconductor layer 14L. In one embodiment, the semiconductor substrate 10L and the topmost semiconductor layer 14L are both comprised of silicon.

In some embodiments, the semiconductor substrate 10L and the topmost semiconductor layer 14L may have a same crystal orientation. In other embodiments, the semiconductor substrate 10L and the topmost semiconductor layer 14L may have a different crystal orientation. The crystal orientation of the semiconductor substrate 10L and/or the topmost semiconductor layer 14L may be {100}, {110}, or {111}. Other crystallographic orientations besides those specifically mentioned can also be used in the present application. The semiconductor substrate 10L and/or the topmost semiconductor layer 14L may be a single crystalline semiconductor material, a polycrystalline material, or an amorphous material. Typically, at least the topmost semiconductor layer 14L is a single crystalline semiconductor material.

The insulator layer 12L may be a crystalline or non-crystalline oxide or nitride. In one embodiment, the insulator layer 12L is an oxide such as, for example, silicon dioxide. In another embodiment, the insulator layer 12L is a nitride such as, for example, silicon nitride or boron nitride. In yet another embodiment, insulator layer 12L includes, in any order, an oxide and a nitride. For example, a silicon dioxide/silicon nitride or silicon dioxide/boron nitride stack may be used as the insulator layer 12L.

The SOI substrate shown in FIG. 1 may be formed utilizing standard processes including for example, SIMOX (Separation by IMplantation of OXygen) or layer transfer. When a layer transfer process is employed, two semiconductor wafers (at least one of which includes an insulator layer) are typically bonded together.

In one embodiment of the present application, the topmost semiconductor layer 14L can have a thickness from 10 nm to 100 nm. Other thicknesses that are greater than, or lesser than, the aforementioned thickness range can also be used as the thickness of the topmost semiconductor layer 14L. In some embodiments, a thinning step such as, for example, planarization or etching can be used to reduce the thickness of topmost semiconductor layer 14L to a value within a desired thickness range.

The insulator layer 12L typically has a thickness from 1 nm to 200 nm, with a thickness from 100 nm to 150 nm being more typical. Other thicknesses that are greater than, or lesser than, the aforementioned thickness ranges can also be used as the thickness of insulator layer 12L. The thickness of the semiconductor substrate 10L is inconsequential to the present application. The insulator layer 12L may also be referred to as a buried insulator since it is sandwiched between the topmost semiconductor layer 14L and the semiconductor substrate 10L.

Figure 2:
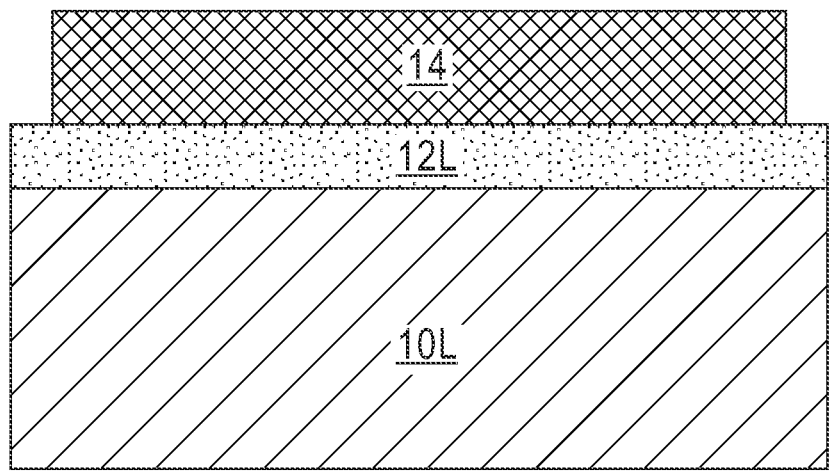
FIG. 2 is a cross sectional view of the exemplary semiconductor structure of FIG. 1 after patterning the topmost semiconductor layer of the SOI substrate to provide a semiconductor fin on a topmost surface of the insulator layer.

Referring now to FIG. 2, there is illustrated the exemplary semiconductor structure of FIG. 1 after patterning the topmost semiconductor layer 14L of the SOI substrate to provide a semiconductor fin 14 on a topmost surface of the insulator layer 12L. Although the present application describes and illustrates a single semiconductor fin 14, a plurality of semiconductor fins can be formed extending upwards from different portions of the insulator layer 12L.

In one embodiment, the patterning process used to define the semiconductor fin 14 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers (i.e., topmost semiconductor layer 14L) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. The etch stops on a topmost surface of the insulator layer 12L

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material or stack of semiconductor materials (in the present case the semiconductor fin 14 includes a remaining portion of the topmost semiconductor layer 14L), and including a pair of vertical sidewalls that are parallel to each other. As used herein, a surface is "vertical" if there exists a vertical plane from which the surface does not deviate by more than three times the root mean square roughness of the surface. In one embodiment of the present application, the semiconductor fin 14 may have a width from 4 nm to 30 nm; the height of the semiconductor fin 14 is determined by the thickness of the topmost semiconductor layer 14L of the SOI substrate. Other widths that are lesser than, or greater than the range mentioned herein can also be used in the present application. Each semiconductor fin within a given device region can be separated by a pitch of from 20 nm to 100 nm. Also, each semiconductor fin 14 is oriented parallel to each other.

Figure 3:
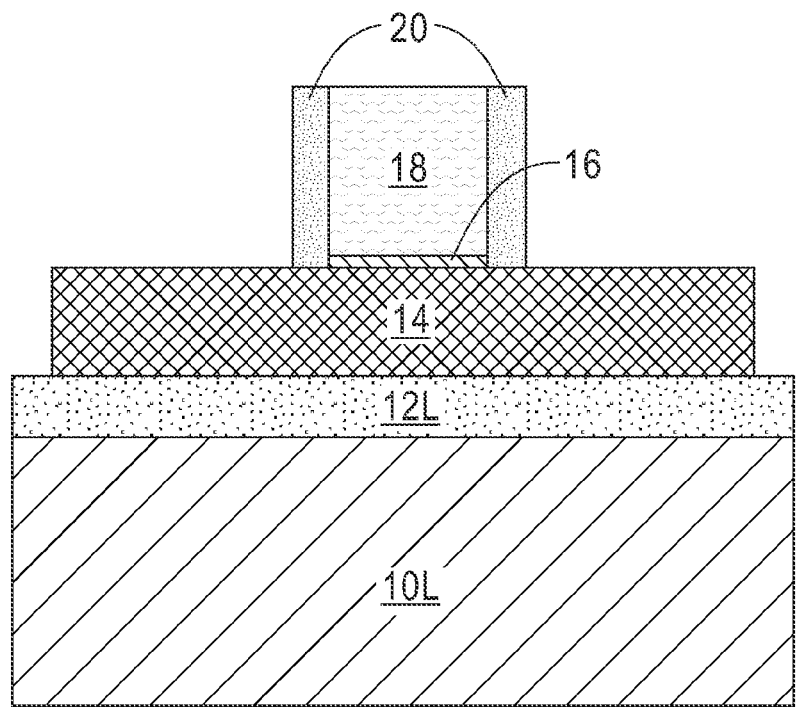
FIG. 3 is a cross sectional view of the exemplary semiconductor structure of FIG. 2 after forming a gate structure straddling over a portion of the semiconductor fin and a gate spacer straddling over another portion of the semiconductor fin.

Referring now to FIG. 3, there is illustrated the exemplary semiconductor structure of FIG. 2 after forming a gate structure (16, 18) straddling over a portion of the semiconductor fin 14 and a gate spacer 20 straddling over another portion of the semiconductor fin 14. By "straddling over" it is meant that one material is formed atop and along sidewall surfaces of another material. In the drawings the straddling over is not specifically shown since the cross sectional is through the semiconductor fin 14. Although a single gate structure is described and illustrated, a plurality of gate structures can be formed; each gate structure would straddle over a different portion of the semiconductor fin 14 and a gate spacer 20 would be present along sidewall surfaces of each gate structure.

In one embodiment of the present application, each gate structure is a functional gate structure. By "functional gate structure" it is meant a permanent gate structure used to control output current (i.e., flow of carriers in the channel) of a semiconducting device through electrical or magnetic fields. Each first functional gate structure includes a gate material stack of, from bottom to top, a gate dielectric portion 16 and a gate conductor portion 18. In some embodiments (not shown), a gate cap portion can be present atop at least the gate conductor portion 18.

The gate dielectric portion 16 may include a gate dielectric material. The gate dielectric material that provides the gate dielectric portion 16 can be an oxide, nitride, and/or oxynitride. In one example, the gate dielectric material that provides the gate dielectric portion 16 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 16. In some embodiments, a first set of functional gate structures includes a first gate dielectric portion, while a second set of functional gate structures comprises a second gate dielectric portion. In such an embodiment, the first gate dielectric material portion may be the same as, or different from, the second gate dielectric material portion.

The gate dielectric material used in providing the gate dielectric portion 16 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 16 can have a thickness in a range from 1 nm to 10 nm. Other thicknesses that are lesser than, or greater than, the aforementioned thickness range can also be employed for the gate dielectric material that may provide the gate dielectric portion 16.

The gate conductor portion 18 can include a gate conductor material. The gate conductor material used in providing the gate conductor portion 18 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, a first set of functional gate structures includes a first gate conductor portion, while a second set of functional gate structures comprises a second gate conductor portion. In such an embodiment, the first gate conductor portion may be the same as, or different from, the second gate conductor portion. For example, the first gate conductor portion may comprise an nFET gate metal, while the second gate conductor portion may comprise a pFET gate metal. In another example, the first gate conductor portion may comprise a pFET gate metal, while the second gate conductor portion may comprise an nFET gate metal.

The gate conductor material used in providing the gate conductor portion 18 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 18 has a thickness from 1 nm to 100 nm. Other thicknesses that are lesser than, or greater than, the aforementioned thickness range can also be employed for the gate conductor material used in providing the gate conductor portion 18.

If present, gate cap portion of the functional gate structure may include a gate cap material. The gate cap material that provides the gate cap portion may include a hard mask material such as, for example, silicon dioxide, silicon nitride, and/or silicon oxynitride. When a plurality of functional gate structures are formed, the hard mask material of a first gate gap portion of a first set of functional gate structure may be the same as, or different from, the hard mask material of a second gate gap portion of a second set of functional gate structures. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. A patterning process may follow the formation of the functional gate material stack. Block mask technology may be used to selectively provide one of the functional gate structures prior to forming the other functional gate structure.

Next, gate spacer 20 can be formed around each gate structure. The gate spacer 20 is present on the vertical sidewall surfaces of the gate dielectric portion 16 and the vertical sidewalls of the gate conductor portion 18 of the exemplary structure shown in FIG. 3. The gate spacer 20 may include any gate dielectric spacer material such as, for example, silicon dioxide and/or silicon nitride. The gate spacer 20 can be formed by deposition of a gate dielectric spacer material and thereafter etching the deposited gate dielectric spacer material.

In other embodiments of the present application, and prior to forming a functional gate structure, a sacrificial gate structure is formed instead. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for gate dielectric portion. Each sacrificial gate material portion includes one of the gate conductor materials mentioned above for the gate conductor portion. The sacrificial gate cap portion includes one of the gate cap materials mentioned above for the gate cap portion. The sacrificial gate structure can be formed by deposition of the various material layers and then patterning the resultant sacrificial dielectric material sack by utilizing, for example, lithography and etching. Next, gate spacer 20 is formed, and after formation of the source/drain regions, the sacrificial gate structure may be replaced with a functional gate structure as described above.

Figure 4:
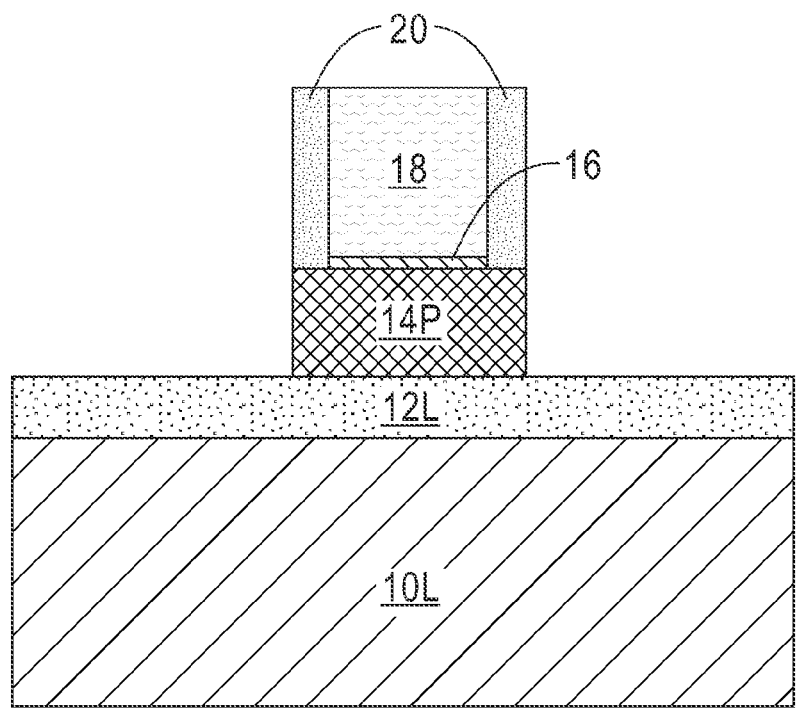
FIG. 4 is a cross sectional view of the exemplary semiconductor structure of FIG. 3 after removing exposed portions of the semiconductor fin not covered by the gate structure or the gate spacer.

Referring now to FIG. 4, there is illustrated the exemplary semiconductor structure of FIG. 3 after removing exposed portions of the semiconductor fin 14 not covered by the gate structure (16, 18) or the gate spacer 20. The remaining portion of the semiconductor fin 14 that is located beneath the gate spacer 20 and the gate structure (16, 18) may be referred to herein as a semiconductor fin portion 14P. In accordance with the present application, the semiconductor fin portion 14P functions as the channel (or body) region of the resultant semiconductor device. As is shown, the semiconductor fin portion 14P has sidewall surfaces that are vertically aligned to outer sidewall surfaces of the gate spacer 20; the inner sidewall surface of the gate spacer 20 directly contacts the vertical sidewall surface of the gate structure.

After removing exposed portions of the semiconductor fin 14 not covered by the gate structure (16, 18) or the gate spacer 20, a portion of the underlying insulator layer 12L on each side of the gate structure (16, 18) is exposed. The removal of the exposed portions of the semiconductor fin 14 not covered by the gate structure (16, 18) or the gate spacer 20 may be performed utilizing an anisotropic etch that is selective in removing the semiconductor material of the semiconductor fin 14 as compared to a dielectric material and a conductive material. In one example, the anisotropic etch includes the use of chlorine as an etchant. In one embodiment, the anisotropic etch is a reactive ion etch.

Figure 5:
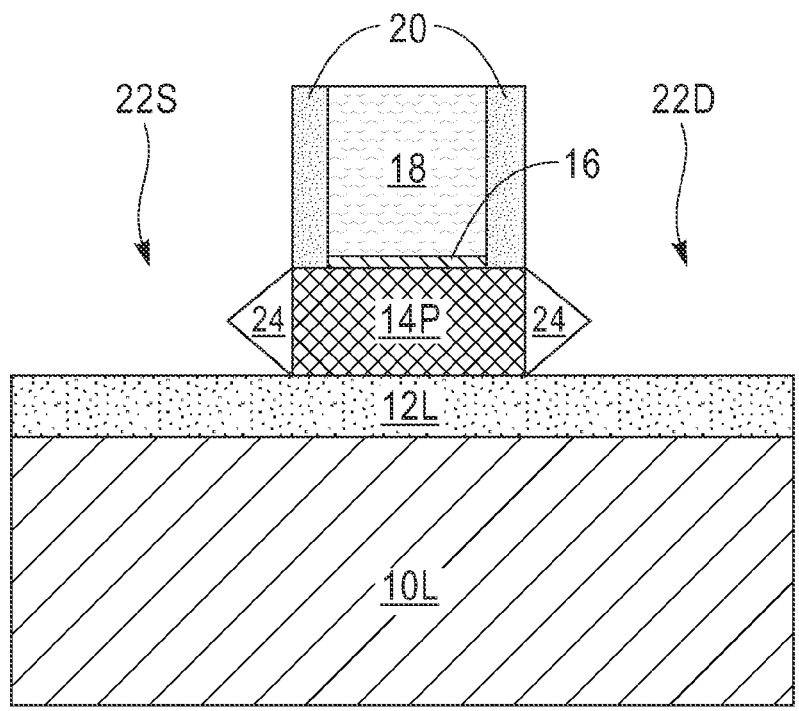
FIG. 5 is a cross sectional view of the exemplary semiconductor structure of FIG. 4 after forming a doped epitaxial semiconductor material structure from exposed end portions of a remaining portion of the semiconductor fin.

Referring now to FIG. 5, there is illustrated the exemplary semiconductor structure of FIG. 4 after forming a doped epitaxial semiconductor material structure 24 from exposed end portions of a remaining portion of the semiconductor fin 14 (i.e., semiconductor fin portion 14P). Each doped epitaxial semiconductor material structure 24 that is formed has faceted surfaces; by "faceted surfaces" it is meant they are bound by (111)-planes. In one embodiment, and as shown, each doped epitaxial semiconductor material structure 24 is diamond shaped, with one surface of the diamond shaped doped epitaxial semiconductor material structure 24 directly contacting a sidewall surface of the semiconductor fin portion 14P. As is shown, a doped epitaxial semiconductor material structure 24 is formed on a source-side 22S of the gate structure (16, 18), while another doped epitaxial semiconductor material structure 24 is formed on a drain-side 22D of the gate structure (16, 18). As is known to those skilled in the art, the source-side is located on an opposite side of the gate structure (16, 18) than the drain-side 22D.

Each doped epitaxial semiconductor material structure 24 includes a semiconductor material and a dopant. The semiconductor material that provides the doped epitaxial semiconductor material structure 24 may include one of the semiconductor materials mentioned above for the semiconductor substrate 10L and the topmost semiconductor layer 14L of the SOI substrate. The semiconductor material that provides each doped epitaxial semiconductor material structure 24 is however different than the semiconductor material that provides the semiconductor fin portion 14P. Thus, the doped epitaxial semiconductor material structure 24 can introduce a stress to the semiconductor fin portion 14P.

The dopant that can be present in each doped epitaxial semiconductor material structure 24 may be a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Notwithstanding the dopant type (i.e., p-type or n-type), the dopant is present in each doped epitaxial semiconductor material structure 24 in a content, i.e., concentration, of from $4\times10^{20}$ atoms/cm$^3$ to $9\times10^{20}$ atoms/cm$^3$.

Each doped epitaxial semiconductor material structure 24 may be formed utilizing a selective epitaxial growth (or deposition) process. The term "selective" when used in conjugation with the phrase "selective epitaxial growth" denotes that the epitaxial material is grown only on semiconductor material surfaces not insulator or conductor surfaces. In the present application, the doped epitaxial semiconductor material structure 24 is grown laterally outward from the sidewall surfaces, i.e., edges, of the semiconductor fin portion 14P.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, each doped epitaxial semiconductor material structure 24 has an epitaxial relationship with a sidewall surface of the semiconductor fin portion 14P.

Examples of various epitaxial growth process apparatuses that can be employed in forming the doped epitaxial semiconductor material structure 24 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

In one embodiment, the doped epitaxial semiconductor material structure 24 can be formed utilizing a precursor gas mixture that includes a silicon containing precursor gas (such as silane) and a germanium containing precursor gas (such as a germane). In another embodiment, the doped epitaxial semiconductor material structure 24 can be formed utilizing a precursor gas mixture that includes a combined silicon-containing and germanium-containing precursor. Carrier gases like hydrogen, nitrogen, helium and argon can be used. In some embodiments, a dopant (as mentioned above) can be introduced into the precursor gas during the epitaxial growth process.

In one example and when the semiconductor fin portion 14P comprises silicon, each doped epitaxial semiconductor material structure 24 is diamond shaped, has a <111> crystal orientation and contains a boron-doped silicon germanium alloy that is formed utilizing an in-situ epitaxial growth process.

Figure 6:
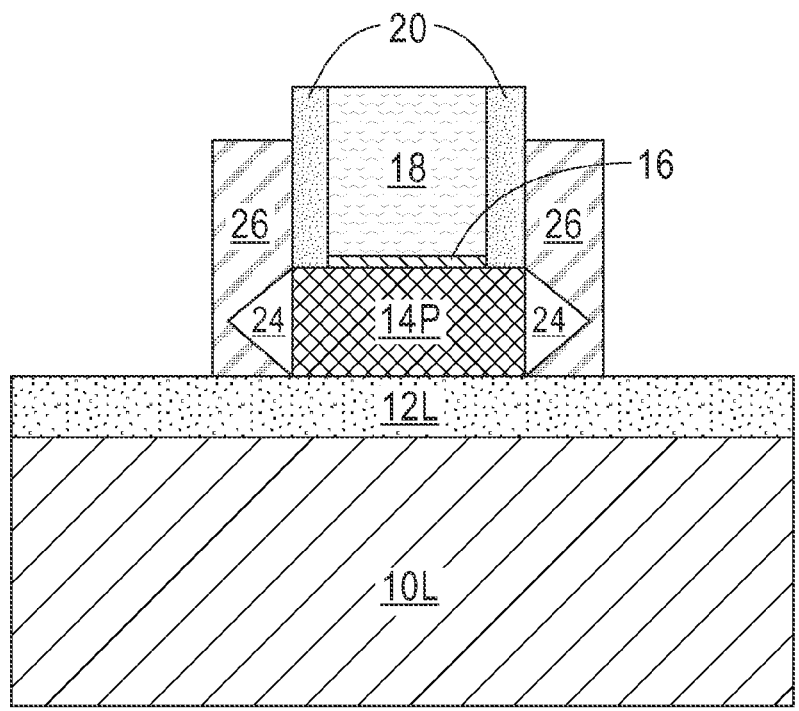
FIG. 6 is a cross sectional view of the exemplary semiconductor structure of FIG. 5 after forming a sacrificial spacer on sidewall surfaces of the gate spacer and covering each doped epitaxial semiconductor material structure.

Referring now to FIG. 6, there is illustrated the exemplary semiconductor structure of FIG. 5 after forming a sacrificial spacer 26 on sidewall surfaces of the gate spacer 20 and covering each doped epitaxial semiconductor material structure 24. As is shown, the sacrificial spacer 26 covers the entirety of the sidewall surfaces of the gate spacer 20 as well as the entirety of exposed surfaces of the doped epitaxial semiconductor material structure 24. As is shown, the topmost surface of the sacrificial spacer 26 is coplanar with a topmost surface of the gate spacer 20 as well as the topmost surface of the gate structure (16, 18).

The sacrificial spacer 26 may include any sacrificial spacer material, typically a dielectric material, that has a different etch selectivity than the gate spacer 20, the gate conductor portion 18, the doped epitaxial semiconductor material structure 24, and the insulator layer 12L. In one embodiment and when the gate spacer 20 comprises silicon nitride, the sacrificial spacer 26 may include, for example, silicon dioxide. The sacrificial spacer 26 can be formed by deposition of a sacrificial spacer material and thereafter etching the deposited sacrificial spacer material.

Figure 7:
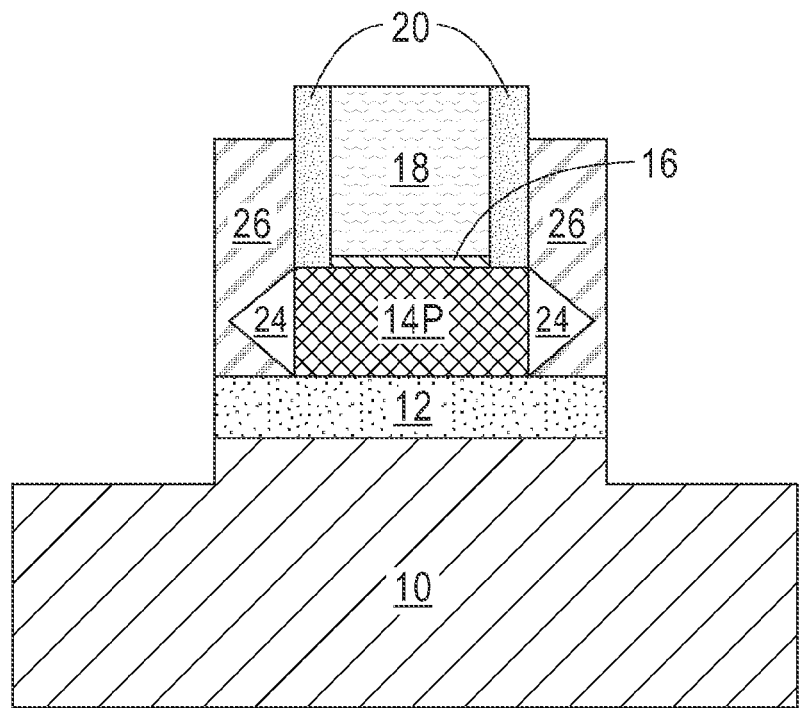
FIG. 7 is a cross sectional view of the exemplary semiconductor structure of FIG. 6 after removing exposed portions of the insulator layer and recessing an exposed surface of the semiconductor substrate.

Referring now to FIG. 7, there is illustrated the exemplary semiconductor structure of FIG. 6 after removing exposed portions of the insulator layer 12L and recessing an exposed surface of the semiconductor substrate 10L. In some embodiments of the present application, and during the removal of the exposed portions of the insulator layer 12L, the height of the sacrificial spacer 26 may be reduced such that the topmost surface of the sacrificial spacer 26 is now below the topmost surface of the gate spacer 20 and the gate structure (16, 18).

The removing exposed portions of the insulator layer 12L and the recessing of the exposed surface of the semiconductor substrate 10L may be performed utilizing at least one anisotropic etching process in which the etch mask includes the sacrificial spacer 26, gate spacer 20, and gate structure (16, 18). The removing exposed portions of the insulator layer 12L and the recessing of the exposed surface of the semiconductor substrate 10L are performed on the source-side 22S and the drain-side 22D of the gate structure (16, 18). In one embodiment, a single etch may be used in removing exposed portions of the insulator layer 12L and the recessing of the exposed surface of the semiconductor substrate 10L. For example, a single reactive ion etch (RIE) may be used to provide the exemplary semiconductor structure shown in FIG. 7. In another embodiment, a first etch (i.e., first reactive ion etch) may be used in removing exposed portions of the insulator layer 12L and a second etch, different from the first etch, (i.e., a second reactive ion) may be used in the recessing of the exposed surface of the semiconductor substrate 10L.

After removing exposed portions of the insulator layer 12L, a portion of the insulator layer 12L remains. The remaining portion of the insulator layer 12L is referred to herein as an insulator layer portion 12. After recessing of the exposed surface of the semiconductor substrate 10L, a portion of the semiconductor substrate 10L remains. The remaining portion of the semiconductor substrate 10L can be referred to herein as a semiconductor substrate portion 10. At this point of the present application, a small mesa region (not labeled) can be formed beneath elements 12, 14P, 24, 26, 16, 18 and 20.

The removing exposed portions of the insulator layer 12L provides an insulator layer portion 12 having sidewall surfaces that are vertically aligned with the outermost sidewall surfaces of the sacrificial spacer 26; the outermost sidewall surface represents a sidewall surface that is opposite the innermost sidewall surface of the sacrificial spacer 26 of which a portion thereof directly contacts the gate spacer 20.

Figure 8:
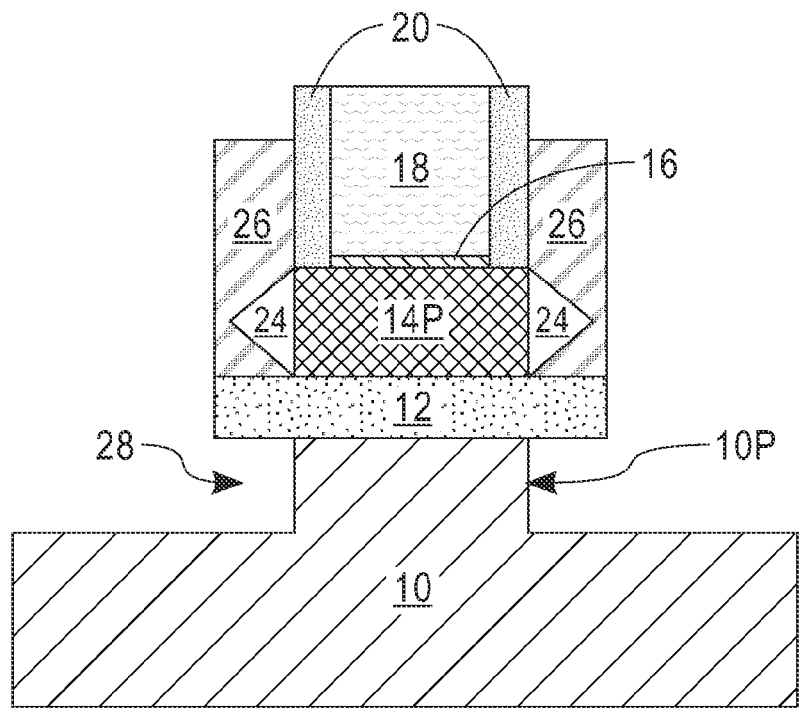
FIG. 8 is a cross sectional view of the exemplary semiconductor structure of FIG. 7 after partially etching the remaining portion of the semiconductor substrate to provide an undercut region beneath a remaining portion of the insulator layer.

Referring now to FIG. 8, there is illustrated the exemplary semiconductor structure of FIG. 7 after partially etching of the remaining portion of the semiconductor substrate (i.e., the semiconductor substrate portion 10) to provide an undercut region 28 beneath a remaining portion of the insulator layer (i.e., the insulator layer portion 12). During this step of the present application, a pedestal portion 10P is formed; the "pedestal portion" is a portion of the semiconductor substrate that rises above other remaining portions of the semiconductor substrate. As shown in FIG. 8, the pedestal portion 10P extends upwards from a remaining portion of the semiconductor substrate (i.e., the semiconductor substrate portion 10). The undercut region 28 exposes a bottommost surface of the insulator layer portion 12.

The partial etching of the remaining portion of the semiconductor substrate (i.e., the semiconductor substrate portion 10) to provide the undercut region 28 can be performed utilizing an etching process that is selective in removing a semiconductor material relative to a dielectric material and a conductor. In one embodiment of the present application, the etching process that can be used to provide the pedestal portion 10P and the undercut region 28 can include ammonia.

In one embodiment of the present application, the pedestal portion 10P of the semiconductor substrate portion 10 has sidewall surfaces that are substantially vertically aligned to the sidewall surfaces of the overlying semiconductor fin portion 14P. By "substantially vertically aligned it is meant from ±0.8 nm from prefect vertical alignment. In one embodiment, the pedestal portion 10P of the semiconductor substrate portion 10 has sidewall surfaces that are perfectly vertically aligned to the sidewall surfaces of the overlying semiconductor fin portion 14P.

Figure 9:
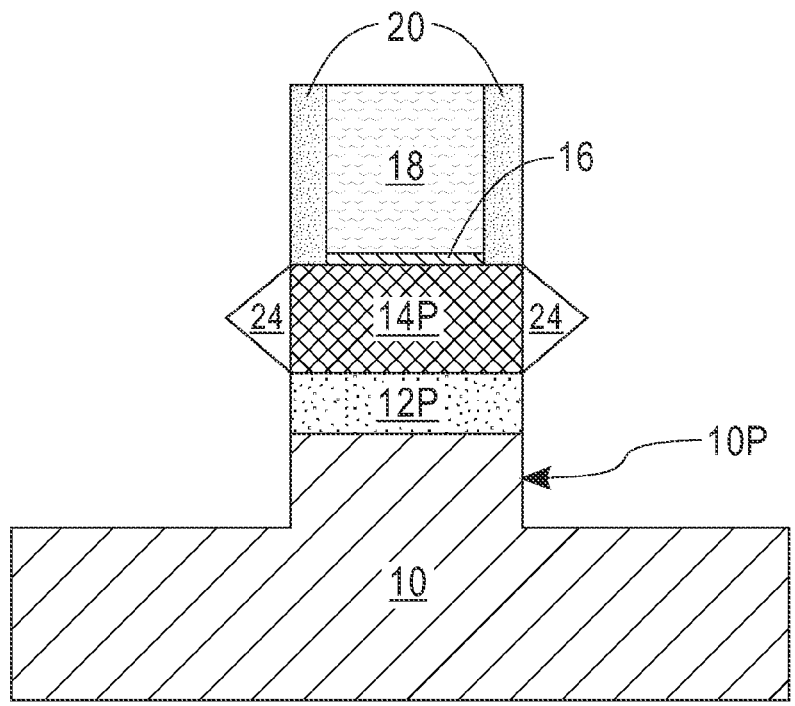
FIG. 9 is a cross sectional view of the exemplary semiconductor structure of FIG. 8 after partially etching the remaining portion of the insulator layer to provide an insulator structure that is substantially vertically aligned with the remaining portion of the semiconductor fin, and removing the sacrificial spacer.

Referring now to FIG. 9, there is illustrated the exemplary semiconductor structure of FIG. 8 after partially etching the remaining portion of the insulator layer (i.e., the insulator layer portion 12) to provide an insulator structure 12P that has sidewall surfaces that are substantially vertically aligned with the sidewall surfaces of the remaining portion of the semiconductor fin (i.e., semiconductor fin portion 14P), and removing the sacrificial spacer 26. By "substantially vertically aligned it is meant from ±0.8 nm from prefect vertical alignment. In one embodiment, the insulator structure 12P has sidewall surfaces that are perfectly vertically aligned to the sidewall surfaces of the overlying semiconductor fin portion 14P. The sidewall surfaces of the insulator structure 12P can also be substantially vertically aligned or perfectly vertically aligned to the sidewall surfaces of the pedestal portion 10P of the semiconductor substrate portion 10.

The partial etching of the insulator layer portion 12 that provides the insulator structure 12P can be performed utilizing an etching process that is selective in removing the insulator layer that provides the insulator layer portion 12 relative to a semiconductor material and the materials that provide the sacrificial spacer 26, the gate spacer 20, and the gate conductor portion 18 or gap cap of the gate structure. In one embodiment of the present application, the etching process that can be used to provide the insulator structure 12P can include chemical oxide removal (COR).

The sacrificial spacer 26 may be removed utilizing an etching process, such as an isotropic etch that is selective in removing the material that provides the sacrificial spacer 26 relative to a semiconductor material, the materials that provide the gate spacer 20, and the gate conductor portion 18 or gap cap of the gate structure.

Figure 10:
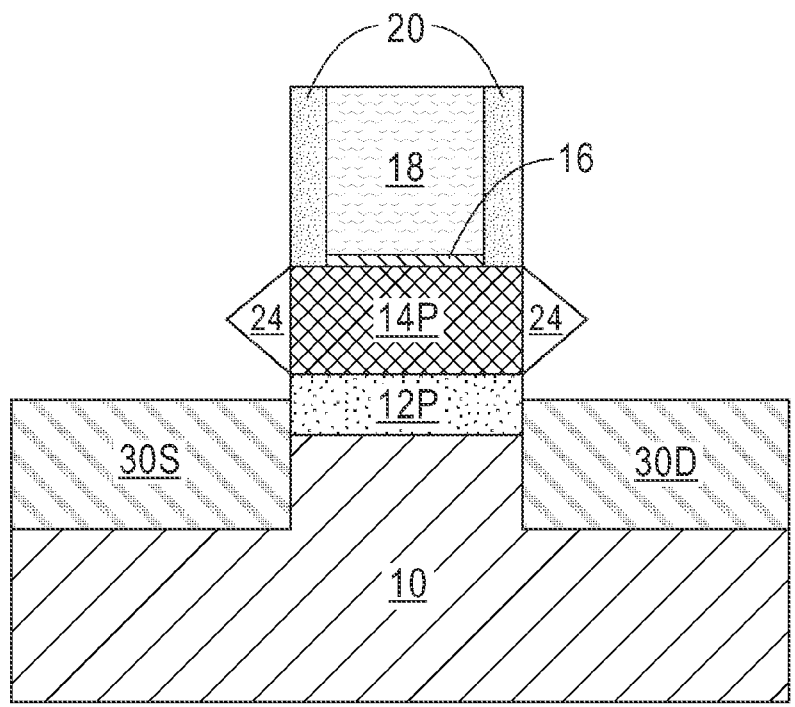
FIG. 10 is a cross sectional view of the exemplary semiconductor structure of FIG. 9 after forming a bottom source-side stressor semiconductor material layer on an exposed subsurface of a remaining portion of the semiconductor substrate and a bottom drain-side stressor semiconductor material layer on another exposed subsurface of the remaining portion of the semiconductor substrate.

Referring now to FIG. 10, there is illustrated the exemplary semiconductor structure of FIG. 9 after a forming a bottom source-side stressor semiconductor material layer 30S on an exposed subsurface of a remaining portion of the semiconductor substrate 10 and a bottom drain-side stressor semiconductor material layer on another exposed subsurface of the remaining portion of the semiconductor substrate 30D. By "subsurface" it is meant a surface of the semiconductor substrate 10L that is located between the topmost surface of the original semiconductor substrate 10L and the bottommost surface of the original semiconductor substrate 10L.

The bottom source-side and drain-side stressor semiconductor material layers (30S, 30D) include a semiconductor material and a dopant. The semiconductor material that provides the bottom source-side and drain-side stressor semiconductor material layers (30S, 30D) includes a different semiconductor than the semiconductor material that provides the semiconductor fin portion 14P. The semiconductor material that provides the bottom source-side and drain-side stressor semiconductor material layers (30S, 30D) may be the same as, or different from, the semiconductor material that provides each doped epitaxial semiconductor material structure 24.

The dopant that can be present in the bottom source-side and drain-side stressor semiconductor material layers (30S, 30D) may be a p-type dopant or an n-type dopant. The dopant within the bottom source-side and drain-side stressor semiconductor material layers (30S, 30D) is typically the same as the dopant within each doped epitaxial semiconductor material structure 24. The dopant content within the bottom source-side and drain-side stressor semiconductor material layers (30S, 30D) is however less than the dopant content in each doped epitaxial semiconductor material structure 24. Typically, the dopant is present in the bottom source-side and drain-side stressor semiconductor material layers (30S, 30D) in a content, i.e., concentration, of from $1 \times 10^{18}$ atoms/cm$^3$ to $1 \times 10^{19}$ atoms/cm$^3$.

The bottom source-side and drain-side stressor semiconductor material layers (30S, 30D) may be formed utilizing a selective epitaxial growth (or deposition) process, as mentioned above. The bottom source-side and drain-side stressor semiconductor material layers (30S, 30D) grow upwards from the exposed subsurface of semiconductor substrate portion 10 and entirely cover the sidewalls of the pedestal portion 10P. In some embodiments, the bottom source-side and drain-side stressor semiconductor material layers (30S, 30D) may have a topmost surface that is coplanar with the topmost surface of the pedestal portion 10P. In yet other embodiments, the bottom source-side and drain-side stressor semiconductor material layers (30S, 30D) may have a topmost surface that is located between the topmost surface and bottommost surface of the insulator layer structure 12P.

Figure 11:
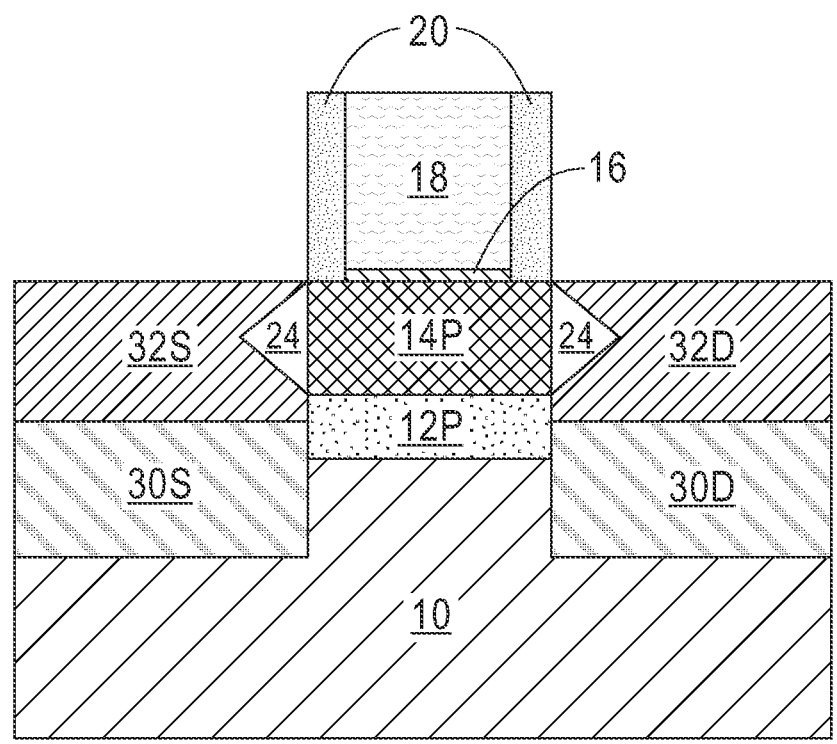
FIG. 11 is a cross sectional view of the exemplary semiconductor structure of FIG. 10 after forming an upper source-side stressor semiconductor material layer on the bottom source-side stressor semiconductor material layer, and an upper drain-side stressor semiconductor material layer on the bottom drain-side stressor semiconductor material layer.

Referring now to FIG. 11, there is illustrated the exemplary semiconductor structure of FIG. 10 after forming an upper source-side stressor semiconductor material layer 32S on the bottom source-side stressor semiconductor material layer 30S, and an upper drain-side stressor semiconductor material layer 32D on the bottom drain-side stressor semiconductor material layer 30D.

The upper source-side and drain-side stressor semiconductor material layers (32S, 32D) include a semiconductor material and a dopant. The semiconductor material that provides the upper source-side and drain-side stressor semiconductor material layers (32S, 32D) may include one of the semiconductor materials mentioned above for doped epitaxial semiconductor material structure 24; the semiconductor material that provides the upper source-side and drain-side stressor semiconductor material layers (32S, 32D) however is different from the semiconductor material that provides the semiconductor fin portion 14P. In one embodiment of the present application, the semiconductor material that provides the upper source-side and drain-side stressor semiconductor material layers (32S, 32D) may comprise a same semiconductor material as doped epitaxial semiconductor material structure 24. In another embodiment of the present application, the semiconductor material that provides the upper source-side and drain-side stressor semiconductor material layers (32S, 32D) may comprise a different semiconductor material than that which provides the doped epitaxial semiconductor material structure layers 24. The upper source-side and drain-side stressor semiconductor material layers (32S, 32D) may comprise a same semiconductor material as the bottom source-side and drain-side stressor material layer (30S, 30D).

The dopant that can be present in the upper source-side and drain-side stressor semiconductor material layers (32S, 32D) may be a p-type dopant or an n-type dopant. The dopant within the upper source-side and drain-side stressor semiconductor material layers (32S, 32D) is typically the same as the dopant within each doped epitaxial semiconductor material structure 24. The dopant content within the upper source-side and drain-side stressor semiconductor material layers (32S, 32D) is however less than the dopant content in each doped epitaxial semiconductor material structure 24. Typically, the dopant is present in the upper source-side and drain-side stressor semiconductor material layers (32S, 32D) in a content, i.e., concentration, of from $4 \times 10^{20}$ atoms/cm$^3$ to $9 \times 10^{20}$ atoms/cm$^3$.

The upper source-side and drain-side stressor semiconductor material layers (32S, 32D) may be formed utilizing a selective epitaxial growth (or deposition) process, as mentioned above. The upper source-side and drain-side stressor semiconductor material layers (32S, 32D) grow upwards from the exposed topmost surface of the bottom source-side and drain-side stressor semiconductor material layers (30S, 30D) and entirely cover the exposed surfaces of the doped epitaxial semiconductor material structure 24. In some embodiments, the upper source-side and drain-side stressor semiconductor material layers (32S, 32D) may have a topmost surface that is coplanar with the topmost surface of the semiconductor fin portion 14P.

Collectively, the bottom source-side stressor semiconductor material layer 30S, and the upper source-side stressor semiconductor material layer 32S provide a source-side stressor structure of the present application. Collectively, the bottom drain-side stressor semiconductor material layer 30D, and the upper drain-side stressor semiconductor material layer 32D provide a drain-side stressor structure of the present application. Each bottom stressor material layer (30S, 30D) constitutes an embedded semiconductor stressor element, while each upper stressor material (32S, 32D) constitutes a raised source/drain region.

Since the doped epitaxial semiconductor material structure 24 is present on the ends of the semiconductor fin portion 14P, the epitaxy growth front of the source-side and drain-side stressor structures is not close to the device channel.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a material stack of, from bottom to top, an insulator structure and a semiconductor fin portion located on a pedestal portion of a semiconductor substrate portion, wherein a doped epitaxial semiconductor material structure is present on an entirety of each sidewall surface of said semiconductor fin portion, each doped epitaxial semiconductor material structure introduces a stress on said semiconductor fin portion;
a gate structure straddling said semiconductor fin portion;
a source-side stressor structure contacting a first subsurface of said semiconductor substrate portion and covering one of said doped epitaxial semiconductor material structures located on a source-side of the gate structure; and
a drain-side stressor structure contacting a second subsurface of said semiconductor substrate portion and covering another of said doped epitaxial semiconductor material structures located on a drain-side of the gate structure.

2. The semiconductor structure of claim 1, wherein said doped epitaxial semiconductor material structure is diamond shaped.

3. The semiconductor structure of claim 1, wherein said source-side stressor structure comprises, from bottom to top, a bottom source-side stressor semiconductor material layer and an upper source-side stressor semiconductor material layer, wherein said bottom source-side stressor semiconductor material layer contacts a sidewall of said pedestal portion.

4. The semiconductor structure of claim 3, wherein said drain-side stressor structure comprises, from bottom to top, a bottom drain-side stressor semiconductor material layer and an upper drain-side stressor semiconductor material layer, wherein said bottom drain-side stressor semiconductor material layer contacts another sidewall of said pedestal portion.

5. The semiconductor structure of claim 1, wherein said gate structure is a functional gate structure.

6. The semiconductor structure of claim 1, wherein said semiconductor fin portion has sidewall surfaces that are substantially vertically aligned or perfectly vertically aligned to sidewall surfaces of said insulator structure.

7. The semiconductor structure of claim 6, wherein said semiconductor fin portion has sidewall surfaces that are substantially vertically aligned or perfectly vertically aligned to sidewall surfaces of said pedestal portion.

8. The semiconductor structure of claim 1, wherein a bottommost surface of said insulator structure directly contacts a topmost surface of said pedestal portion, and a topmost surface of said insulator structure directly contacts a bottommost surface of said semiconductor fin portion.

9. The semiconductor structure of claim 1, wherein said doped epitaxial semiconductor material structure comprises SiGe and said semiconductor fin portion comprises Si.

10. The semiconductor structure of claim 1, further comprising a gate spacer located on sidewall surfaces of said gate structure.

11. A semiconductor structure comprising:
a material stack of, from bottom to top, an insulator structure and a semiconductor fin portion located on a pedestal portion of a semiconductor substrate portion, wherein a doped epitaxial semiconductor material structure extends from each sidewall surface of said semiconductor fin portion, each doped epitaxial semiconductor material structure introduces a stress on said semiconductor fin portion;
a gate structure straddling said semiconductor fin portion;
a source-side stressor structure contacting a first subsurface of said semiconductor substrate portion and covering one of said doped epitaxial semiconductor material structures located on a source-side of the gate structure; and
a drain-side stressor structure contacting a second subsurface of said semiconductor substrate portion and covering another of said doped epitaxial semiconductor material structures located on a drain-side of the gate structure, said source-side stressor structure is entirely spaced apart from said one of said sidewall surfaces of said semiconductor fin portion by one of said epitaxial semiconductor material structures, and said drain-side stressor structure is entirely spaced apart from said another of said sidewall surfaces of said semiconductor fin portion by another of said epitaxial semiconductor material structures.

12. The semiconductor structure of claim 11, wherein said doped epitaxial semiconductor material structure is diamond shaped.

13. The semiconductor structure of claim 11, wherein said source-side stressor structure comprises, from bottom to top, a bottom source-side stressor semiconductor material layer and an upper source-side stressor semiconductor material layer, wherein said bottom source-side stressor semiconductor material layer contacts a sidewall of said pedestal portion.

14. The semiconductor structure of claim 13, wherein said drain-side stressor structure comprises, from bottom to top, a bottom drain-side stressor semiconductor material layer and an upper drain-side stressor semiconductor material layer, wherein said bottom drain-side stressor semiconductor material layer contacts another sidewall of said pedestal portion.

15. A semiconductor structure comprising:
a material stack of, from bottom to top, an insulator structure and a semiconductor fin portion located on a pedestal portion of a semiconductor substrate portion, wherein a doped epitaxial semiconductor material structure extends from each sidewall surface of said semiconductor fin portion, each doped epitaxial semiconductor material structure introduces a stress on said semiconductor fin portion;
a gate structure straddling said semiconductor fin portion;
a gate spacer located on each sidewall of the gate structure and straddling said semiconductor fin portion, wherein sidewalls of said gate spacer are vertically aligned with said sidewall surfaces of said semiconductor fin portion;
a source-side stressor structure contacting a first subsurface of said semiconductor substrate portion and covering one of said doped epitaxial semiconductor material structures located on a source-side of the gate structure; and a drain-side stressor structure contacting a second sub-surface of said semiconductor substrate portion and covering another of said doped epitaxial semiconductor material structures located on a drain-side of the gate structure.

16. The semiconductor structure of claim 15, wherein said doped epitaxial semiconductor material structure is diamond shaped.

17. The semiconductor structure of claim 15, wherein said source-side stressor structure comprises, from bottom to top, a bottom source-side stressor semiconductor material layer and an upper source-side stressor semiconductor material layer, wherein said bottom source-side stressor semiconductor material layer contacts a sidewall of said pedestal portion.

18. The semiconductor structure of claim 17, wherein said drain-side stressor structure comprises, from bottom to top, a bottom drain-side stressor semiconductor material layer and an upper drain-side stressor semiconductor material layer, wherein said bottom drain-side stressor semiconductor material layer contacts another sidewall of said pedestal portion.

* * * * *